United States Patent [19]

Shou et al.

[11] Patent Number: 5,471,161
[45] Date of Patent: Nov. 28, 1995

[54] CIRCUIT FOR CALCULATING THE MINIMUM VALUE

[75] Inventors: Guoliang Shou; Weikang Yang; Wiwat Wongwarawipat; Sunao Takatori; Makoto Yamamoto, all of Tokyo, Japan

[73] Assignees: Yozan Inc.; Sharp Corporation, both of Tokyo, Japan

[21] Appl. No.: 322,407

[22] Filed: Oct. 12, 1994

Related U.S. Application Data

[63] Continuation of Ser. No. 986,765, Dec. 8, 1992, abandoned.

[30] Foreign Application Priority Data

Aug. 26, 1992 [JP] Japan .................................. 4-252093

[51] Int. Cl.$^6$ .................................................. H03K 5/153
[52] U.S. Cl. ............................................ 327/58; 326/119
[58] Field of Search ................................. 307/451, 448, 307/355, 243, 464; 326/35, 36; 327/58, 62, 63

[56] References Cited

U.S. PATENT DOCUMENTS

| | | | |
|---|---|---|---|
| 4,613,772 | 9/1986 | Young | 307/443 |
| 4,621,207 | 11/1986 | Suganuma | 307/450 |
| 4,896,059 | 1/1990 | Goodwin-Johansson | 307/448 |
| 5,003,196 | 3/1991 | Kawaguchi | 307/358 |

OTHER PUBLICATIONS

Geiger, et al. "VLSI Design Techniques For Analog And Digital Circuits", 1990, pp. 174–180 and 192–201.

M. Bhansali and C. Munoz–Bustamante, IBM Technical Disclosure Bulletin, Maximum and Minimum Voltage Detection, Oct. 1984, vol. 27, No. 5, pp. 2908–2910.

Patent Abstracts of Japan, vol. 014, No. 525 (P–1132) Nov. 1990 re JP-A-22 21 870.

Patent Abstracts of Japan, vol. 016, No. 125 (P–1331) Mar. 1992 re JP-A-32 91 571.

Patent Abstracts of Japan, vol. 016, No. 365 (P–1397) Aug. 1992 re JP-A-41 13 275.

Patent Abstracts of Japan, vol. 11, No. 212 (E–522) (2659) Jul. 1987 re JP-A-62 034 416.

Patent Abstracts of Japan, vol. 11, No. 212 (E–522)(2659) Jul. 1987 re JP-A-62 034 417.

Patent Abstracts of Japan, vol. 5, No. 99 (E–63)(771) Jun. 1981 re JP-A-56 044 218.

Electronics Handbook, Electronic Society, May 18, 1975, pp. 1703–1704.

Handbook for the Most Use of Analog IC, CQ Publishing Kabushiki Kaisha, Jan. 20, 1992, pp. 135–142.

Primary Examiner—Edward P. Westin
Assistant Examiner—Andrew Sanders
Attorney, Agent, or Firm—Cushman, Darby & Cushman

[57] ABSTRACT

A circuit calculating the minimum value comprising a plural number of pMOS, wherein source of the plural pMOS are connected to a power source with lower voltage than a drain, the drain is grounded through high resistance, in input voltage is connected to each pMOS, and a common output is connected to a drain of each pMOS.

1 Claim, 1 Drawing Sheet

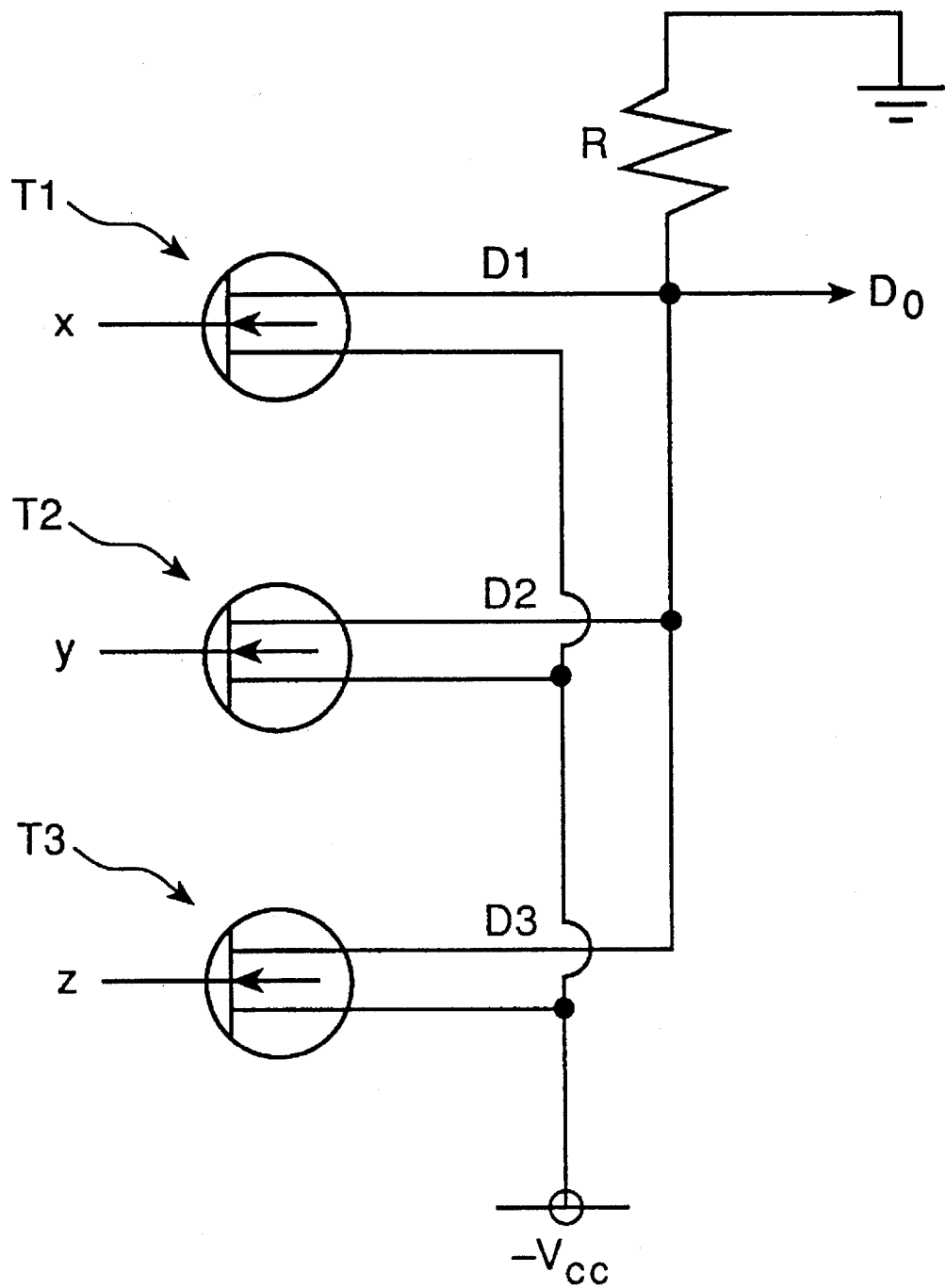

CIRCUIT FOR CALCULATING THE MINIMUM VALUE

This is a continuation of Application Ser. No. 07/986,765, filed on Dec. 8, 1992, now abandoned.

BACKGROUND OF THE INVENTION

FIELD OF THE INVENTION

The present invention relates to a circuit for calculating a minimum value by outputting the minimum input of a plurality of inputs.

BACKGROUND OF THE INVENTION

The calculation of a minimal value of a plural number of data, has normally been performed by digital computers. A digital computer requires a rather large structure like comparison circuits and multiplexer. Moreover, a plurality of steps are required to obtain the minimum value when a digital computer is used.

SUMMARY OF THE INVENTION

The present invention solves the problems noted above and is a relatively small circuit which operates rather quickly.

The circuit for calculating a minimal value according to the present invention utilizes the switching characteristic of a plurality of pMOS field-effect transistors. All of the pMOS transistors remain inactive except the one which receives the minimum input. The circuit is constructed by connecting the drain of pMOS transistors to a common output, an input voltage is supplied to the gate of each pMOS transistor. The pMOS transistor receiving the minimum input becomes conductive, thereby generating a voltage at the drain of the pMOS transistors.

BRIEF DESCRIPTION OF THE DRAWING

FIG. 1 shows a circuit of an embodiment according to the present invention.

PREFERRED DESCRIPTION OF THE EMBODIMENT

An embodiment of a circuit for calculating a minimum value will now be described with reference to FIG. 1.

In FIG. 1, the circuit for calculating a minimal value connects a plurality of pMOS transistors ("T1", "T2" and "T3") in parallel. Input voltage "x", "y" and "z" are input to T1, T2 and T3, respectively. T1, T2 and T3 have drain outputs D1, D2 and D3, respectively. These outputs are connected to the common output Do.

Each pMOS transistor has the characteristic as shown below when an output equivalent to the input voltage is generated at the drain as D1=x, D2=y, and D3=z.

When the conditions are such that x<y and x<z, T1 activates and D1 becomes equivalent to x. The drain voltage of T2 and T3 becomes lower than their corresponding gate voltage. Therefore, T2 and T3 remain inactive and D1 is Do. The calculating circuit acts in a similar manner when y or z is the minimal value.

The above embodiment connects three pMOS transistors in parallel. It is possible to output a minimum input voltage for two or more input voltages by connecting a number of pMOS transistors equalling the number of inputs in parallel.

The time it takes to obtain the output is almost equal to the response time of the pMOS transistor having the minimum value. This circuit can operate at a higher speed than a digital circuit. The size of the circuit is very small, as is clear from the structure shown in FIG. 1.

As mentioned above, the circuit for calculating a minimum value is small in size and operates relatively quickly because the minimal value of each pMOS transistor is generated by the common output by connecting the drain of the pMOS transistors to the common output.

What is claimed is:

1. A circuit for outputting a minimum voltage of one of a plurality of inputs comprising:

a common output;

a resistance having a first terminal which is grounded and a second terminal; and a plurality of pMOS transistors, wherein each one of said plurality of pMOS transistors corresponds to one of said plurality of inputs, and wherein each said pMOS transistor comprises:

a transistor source connected to a common power source;

a transistor drain connected to said second terminal and to said common output; and a transistor gate connected to said corresponding one of said plurality of inputs; and wherein one of said plurality of transistors that receives a minimum voltage of said plurality of inputs conducts, causing said minimum input voltage to be applied to said drain of each remaining transistor so that each remaining transistor becomes non-conductive because each gate voltage becomes higher than a drain voltage for each remaining transistor, and wherein said pMOS transistors are connected within said circuit such that a minimal amount of current is drawn therethrough.

* * * * *